United States Patent
Fröjd

(10) Patent No.: US 8,446,157 B2
(45) Date of Patent: May 21, 2013

(54) CAPACITANCE METER, METHOD, COMPUTER PROGRAM AND COMPUTER PROGRAM PRODUCT FOR IMPROVED CAPACITANCE MEASUREMENT

(75) Inventor: Hans Olof Fröjd, Gävle (SE)

(73) Assignee: ABB Technology AG, Zürich (CH)

( * ) Notice: Subject to any disclaimer, the term of this patent is extended or adjusted under 35 U.S.C. 154(b) by 307 days.

(21) Appl. No.: 12/884,346

(22) Filed: Sep. 17, 2010

(65) Prior Publication Data

US 2011/0068811 A1  Mar. 24, 2011

(30) Foreign Application Priority Data

Sep. 18, 2009  (EP) .................................. 09170653

(51) Int. Cl.
*G01R 27/26*  (2006.01)
(52) U.S. Cl.
USPC ............................................ 324/681; 324/674
(58) Field of Classification Search
USPC .......................................... 324/658, 681, 674
See application file for complete search history.

(56) References Cited

U.S. PATENT DOCUMENTS

| | | | |
|---|---|---|---|
| 4,849,686 A | 7/1989 | Lyyra | |
| 5,283,528 A | 2/1994 | Van Seeters | |
| 5,504,430 A | 4/1996 | Andersson | |
| 6,707,306 B1 | 3/2004 | Wendt | |
| 7,046,017 B1 | 5/2006 | Drost et al. | |
| 7,173,438 B2 | 2/2007 | Pooranakaran et al. | |
| 2003/0218473 A1 | 11/2003 | Yamashita et al. | |
| 2006/0192568 A1 | 8/2006 | Pasero et al. | |
| 2007/0194800 A1 | 8/2007 | Novikov et al. | |
| 2008/0068029 A1 | 3/2008 | Tanida et al. | |

FOREIGN PATENT DOCUMENTS

| | | |
|---|---|---|
| EP | 0555526 B1 | 8/1993 |
| GB | 2246639 A | 2/1992 |
| WO | WO-2008/010634 A1 | 1/2008 |

OTHER PUBLICATIONS

European Search Report—Mar. 18, 2010.

*Primary Examiner* — Vincent Q Nguyen
(74) *Attorney, Agent, or Firm* — Venable LLP; Eric J. Franklin

(57) ABSTRACT

A capacitance meter including an AC source providing a measurement voltage with a measurement frequency to a capacitor. A current sensor is arranged to measure a current going to or from the capacitance meter. A voltage sensor is arranged to measure a voltage over the capacitor. A capacitance calculation unit is arranged to calculate, using a controller, a capacitance of the capacitor using a measured current from the current sensor, a measured voltage from the voltage sensor and the measurement frequency. The capacitance meter is arranged to obtain measurements using the current sensor and the voltage sensor during a measurement duration. The measurement frequency and the measurement duration are selected such that the measurement duration equals a multiple of the period of the measurement frequency, and the measurement duration equals a multiple of the period of a mains electricity.

10 Claims, 3 Drawing Sheets

US 8,446,157 B2

CAPACITANCE METER, METHOD, COMPUTER PROGRAM AND COMPUTER PROGRAM PRODUCT FOR IMPROVED CAPACITANCE MEASUREMENT

CROSS-REFERENCE TO RELATED APPLICATIONS

This application claims priority to European patent application 09170653.1 filed 18 Sep. 2009.

BACKGROUND

Since the advent of capacitors, there has been a need to measure the main magnitude of capacitors, i.e. the capacitance.

One known way to measure a capacitance is to connect an alternating current to the capacitor and observe the voltage.

Since an alternating current is used, the current could be affected by a mains current in the vicinity of the capacitor, the capacitor meter or cables connecting the two. It is known to select frequencies for the alternating current which is not a multiple of the mains frequencies 50 or 60 Hz. For example, it is known to select frequencies such as 111 Hz and 222 Hz, to reduce any effect of the fundamental frequencies and harmonics of the mains current. However, this strategy still allows for a significant interference from a mains current, whereby there is a need to further reduce interference from surrounding mains currents when measuring capacitance.

SUMMARY

The present invention overcomes or at least reduces the problems of the prior art.

It is presented a capacitance meter comprising: an AC source providing a measurement voltage with a measurement frequency to a capacitor; a current sensor arranged to measure a current going to or from the capacitance meter; a voltage sensor arranged to measure a voltage over the capacitor; and a capacitance calculation unit arranged to calculate, using a controller, a capacitance of the capacitor using a measured current from the current sensor, a measured voltage from the voltage sensor and the measurement frequency. The capacitance meter is arranged to obtain measurements using the current sensor and the voltage sensor during a measurement duration. The measurement frequency and the measurement duration are selected such that the measurement duration equals a multiple of the period of the measurement frequency, and the measurement duration equals a multiple of the period of a mains electricity.

Because of this deliberate selection of measurement duration and measurement frequency, any interference effect of a mains signal is significantly reduced or even eliminated, since the positive and negative contributions from the mains signal take each other out, when seen from the whole measurement duration.

The measurement duration may equal a multiple of the period of a 50 Hz mains electricity.

The measurement duration may equal a multiple of the period of a 60 Hz mains electricity.

The measurement duration may equal a multiple of the period of a 50 Hz mains electricity and the measurement duration equals a multiple of the period of a 60 Hz mains electricity. In this way, the capacitance meter is arranged to be used anywhere, regardless if the mains signal is of 50 Hz or 60 Hz.

The measurement duration may be selected to be 100 ms or a multiple thereof.

The measurement frequency may be a multiple of 10 Hz.

The capacitance meter may further comprise a second current sensor arranged to measure a current going to or from the capacitor, wherein the current going to or from the capacitor is used by the capacitance calculation unit to calculate the capacitance of the capacitor. This allows the capacitance meter to measure a single capacitance when this is arranged in parallel with other capacitors.

A second aspect of the invention is a method to measure a capacitance of a capacitor using a capacitance meter, comprising the steps of: providing, using an AC source, a measuring voltage with a measurement frequency to the capacitor; during a measurement duration, measuring, using a current sensor, a current going to or from the capacitance meter, and measuring, using a voltage sensor, a voltage over the capacitor; and calculating, using a capacitance calculation unit, a capacitance of the capacitor using the measured current, the measured voltage and the measurement frequency. The measurement frequency and the measurement duration are selected such that the measurement duration equals a multiple of the period of the measurement frequency, and the measurement duration equals a multiple of the period of a mains electricity.

The step of calculating comprises calculating the capacitance of the capacitor using the following formula:

$$C = \frac{I}{2\Pi f U}$$

where C is the capacitance of the capacitor, I is the measured current, f is the measuring frequency and U is the measured voltage.

A third aspect of the invention is a computer program for measuring capacitance, the computer program comprising computer program code which, when run on in a capacitance meter, causes the capacitance meter to perform the method according to the second aspect.

A fourth aspect of the invention is a computer program product comprising a computer program according to the third aspect and a computer readable means on which the computer program is stored.

It is to be noted than any feature of the first, second, third and fourth aspects can be used in any other aspects where applicable.

When the frequency of a signal, such as frequency of the measurement signal, is mentioned herein, it is to be interpreted as the fundamental frequency, unless explicitly stated otherwise.

Whenever the term equals is used herein, it is to be interpreted to be the same within a margin of error. The margin of error is set appropriately, such as to a few percent or similar.

Whenever the term mains frequency is used herein, it is to be interpreted as a frequency of the power distribution network.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF DRAWINGS

The invention is now described, by way of example, with reference to the accompanying drawings, in which.

DETAILED DESCRIPTION OF PREFERRED EMBODIMENTS

The present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
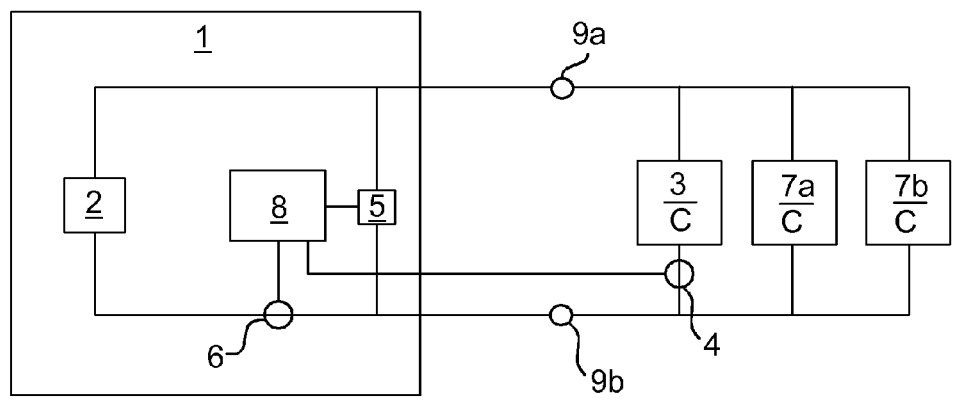
FIG. 1 is a schematic diagram showing a capacitance meter according to an embodiment of the present invention, where the focus is on elements used to measure a capacitance of a component to be tested.

FIG. 1 is a schematic diagram showing a capacitance meter 1 according to an embodiment of the present invention, where the focus is on elements used to measure a capacitance of a capacitor 3. It is to be noted that while the capacitive effects of the capacitor 3 are dominant, there may be resistive and inductive components to the capacitor 3 and/or cabling connecting the capacitor 3 and the capacitance meter 1. It will be shown below with reference to FIG. 4 how the effect of resistive components can be reduced or even eliminated. The capacitor 3 can for example be a capacitor in a capacitor bank.

The capacitance meter 1 connects to the capacitor 3 by means of connectors 9a-b. The capacitance meter 1 comprises an AC voltage source 2 which generates a measurement voltage. The AC voltage source 2 typically comprises resistors and other components (not shown) as well as the actual power source. The AC source can comprise a battery and an inverter to generate the AC power. The capacitance meter 1 is adapted to measure capacitances from 1 to 1000 µF. The AC voltage source can for example be controlled using pulse width modulation from a microprocessor (e.g. controller 8). The AC voltage source further comprises an amplifier and a low pass filter, e.g. an inductor. While the AC source can have any suitable output voltage, it can be restricted to 1-1.4 volts in order to stay below the trigger voltage of any connected diodes.

The AC measurement voltage will result in a current going to and from the capacitor 3. A voltage sensor 5, such as a voltmeter, measures the voltage across the capacitor 3 and a current sensor 6, such as a ammeter, measures the current going to and from the capacitor 3.

Optionally, there are other capacitors 7a-b connected in parallel to the capacitor 3 to be measured. In this situation, a second current sensor 4 is used to measure the current going to or from the capacitor 3 to be measured. The second current sensor 4 is also connected to the controller 8 for calculation of the capacitance of the capacitor 3 to be measured.

A controller 8 oversees the whole measurement process and calculates a measured capacitance using the measured voltage and current. The controller can be a CPU (Central Processing Unit), a FPGA (Field-programmable Gate Array), a DSP (Digital Signal Processor) or any suitable programmable electronic logic unit.

In order to reduce the risk of singularities affecting the measurement, the capacitance measurement can be performed three times, whereby the median value is used as the measured capacitance. Optionally, the measurement is performed at two different frequencies, where three measurements are taken at the two frequencies. The measurement used can then be taken as the average of the two median values of the six measurements.

Figure 2:
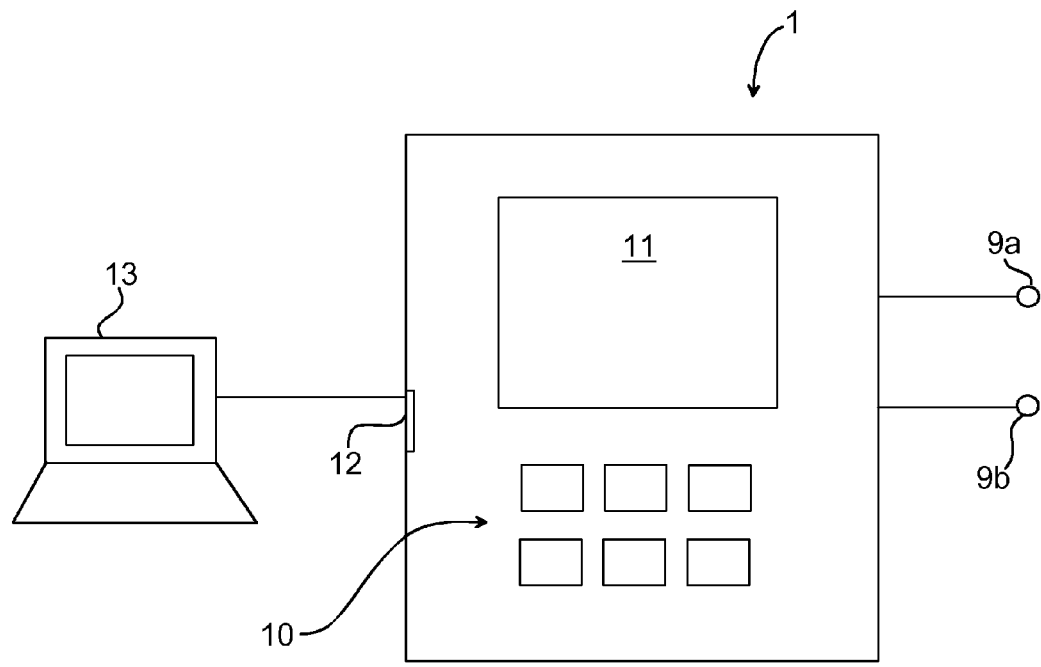
FIG. 2 is a schematic diagram showing the capacitance meter of FIG. 1, where the focus is on interfaces of the capacitance meter.

FIG. 2 is a schematic diagram showing the capacitance meter of FIG. 1, where the focus is on interfaces of the capacitance meter. The capacitance meter 1 comprises a display 11 and a keypad 10. This allows a user to interface with the capacitance meter 1, e.g. to measure capacitance of a specific capacitor 3 and store the measured capacitance along with an identity of the capacitor, allowing history to be kept.

An data interface 12 allows the capacitance meter 1 to send and/or receive data with a computer 13, such as a general purpose stationary or portable computer. The data interface 12 can for example be an interface of type USB (Universal Serial Bus), a Centronics parallel interface, an RS-232 serial interface, or an Ethernet interface. The data interface 12 can also be a wireless interface such as Bluetooth, wireless LAN or wireless USB interface. For example, the data interface 12 can be used to allow central collection of capacitance measurements.

Figure 3A:
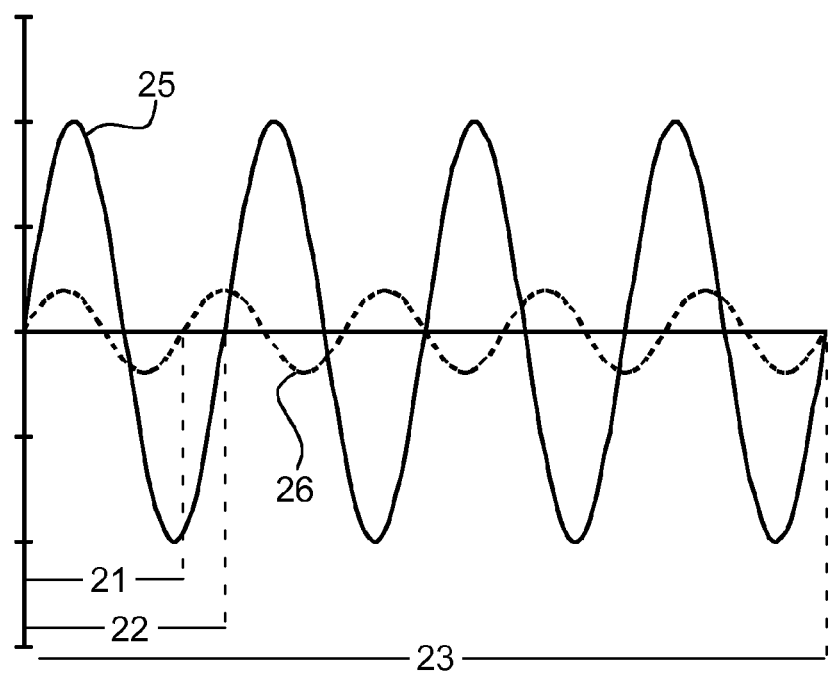
FIG. 3a is a graph showing measurement duration and measurement frequency of the capacitance meter of FIGS. 1 and 2 in relation to a 50 Hz mains frequency.

FIG. 3a is a graph showing measurement duration 23 and measurement frequency of the capacitance meter 1 of FIGS. 1 and 2 in relation to a 50 Hz mains frequency. A measurement signal 25 representing the measurement voltage is shown as well as a mains signal 26 representing a 50 Hz mains frequency. A measurement duration 23 is the time during which the measurement signal 25 is generated and measurements are collected using the voltage sensor and the current sensor. In this example, the measurement signal 25 has a frequency of 40 Hz and the measurement duration 23 is 100 ms.

Consequently, the period 22 of the measurement signal 25 is 25 ms, whereby the measurement duration 23 equals four periods 22 of the measurement signal 25. The period 21 of the mains signal 26 is ⅕₀ s which equals 20 ms, whereby five periods 21 of the mains signal 26 correspond to the measurement duration 23. In other words, the measurement duration 23 is selected to be a multiple of the 50 Hz signal period 21 and also to be a multiple of the measurement signal period 22. Because of this deliberate selection of measurement duration 23 and measurement signal frequency, any interference effect of a mains signal 26 is reduced or even eliminated, since the positive and negative contributions from the mains signal 26 take each other out.

Figure 3B:
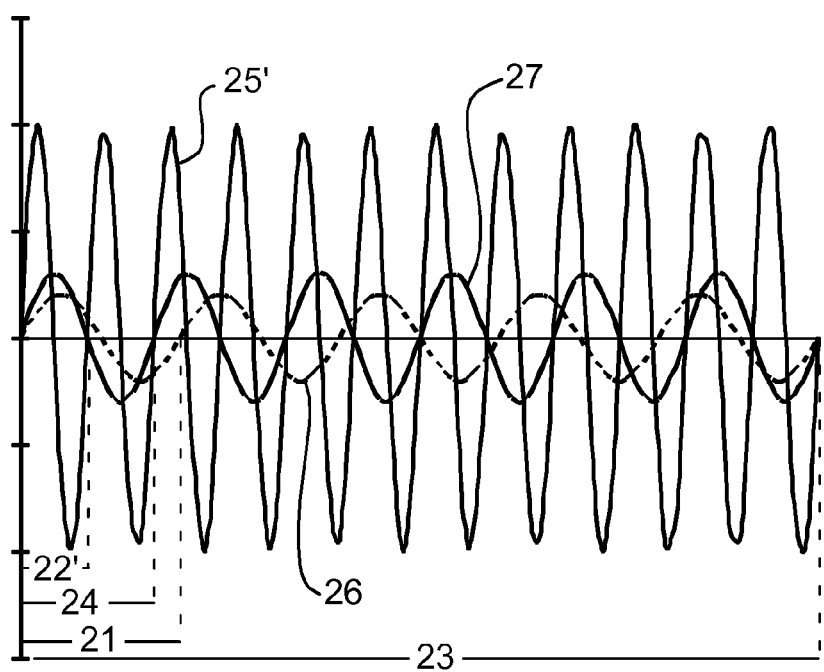
FIG. 3b is a graph showing measurement duration and measurement frequency of the capacitance meter of FIGS. 1 and 2 in relation to both a 50 Hz mains frequency and a 60 Hz mains frequency.

FIG. 3b is a graph showing measurement duration 23 and measurement frequency of the capacitance meter 1 of FIGS. 1 and 2 in relation to both a 50 Hz mains frequency and a 60 Hz mains frequency. Here, the measurement signal 25' has a frequency of 120 Hz, which corresponds to a measurement signal period 22' of approximately 8.333 ms. The 50 Hz mains signal 26 is the same as in FIG. 3*a*, but here there is also a 60 Hz mains signal 27 with a period 24 of 1/60 s which is approximately 16.67 ms. The 60 Hz mains signal 27 is typically not present at the same time as the 50 Hz mains signal 26 in the field. Nevertheless, with the deliberate selection of the measurement duration 23, being a multiple also of the 60 Hz mains signal period, there is a full number of 60 Hz mains signal periods 24 during the measurement duration 23, whereby the positive and negative effects of the interference counteract each other to significantly reduce or even eliminate the effect of the 60 Hz signal on the measurement. In other words, the same configuration of the capacitance meter 1 works to reduce or eliminate interference from either of 50 Hz or 60 Hz interference sources.

It is to be noted that the shortest time which is a multiple of both a 50 Hz period 21 and a 60 Hz period 24 is 100 ms. Consequently, any multiple of 100 ms will also be a multiple of both the 50 Hz period 21 and the 60 Hz period 24. In order to allow the measurement duration 23 to be a multiple of the period 22, 22' of the measurement signal 25, 25', the frequency of the measurement signal 25, 25' can be selected to be any multiple of 10 Hz. However, it may be efficient to select a frequency of which the sampling frequency is a multiple.

Figure 4:
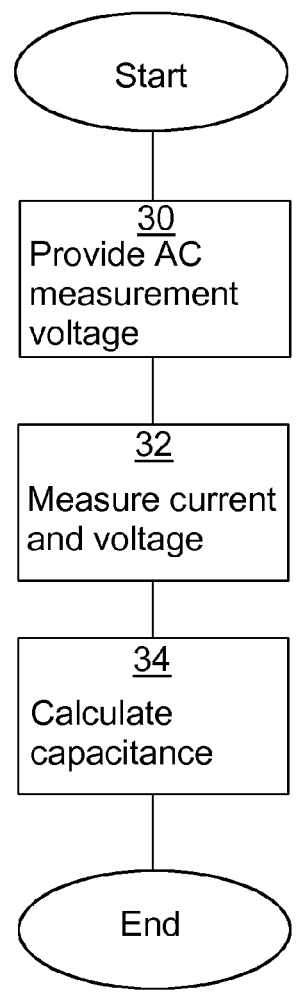
FIG. 4 is a flow chart showing a method which can be executed in the capacitance meter of FIGS. 1 and 2.

FIG. 4 is a flow chart showing a method which can be executed in the capacitance meter 1 of FIGS. 1 and 2. The method starts when a measurement is triggered, e.g. by a user of the capacitance meter 1 activating capacitance measurement.

In an initial provide AC measurement voltage step 30 an AC measurement voltage is provided to the capacitor to be measured.

In a measure current and voltage step 32, the current and voltage are measured. This step (as well as the previous step) are continued during and only during the measurement period and are subsequently stopped.

In a calculate capacitance step 34, the capacitance of the capacitor is calculated according to the following:

A capacitive reactance $X_C$ of a capacitor with capacitance C is calculated as follows:

$$X_C = -\frac{1}{2\Pi f C} \quad (1)$$

which can be rearranged to:

$$C = \frac{1}{2\Pi f X_C} \quad (2)$$

This can be re-written using Ohm's law to:

$$C = \frac{I}{2\Pi f U} \quad (3)$$

where I is the current through the capacitor and U is the voltage across the same.

If the resistance of the cables are known or measured, the effect of the resistance can be taken into account to obtain more accuracy. The capacitance is then calculated using the following formula, using Pythagoras theorem in the complex plane:

$$C = \frac{I_C}{2\Pi f \sqrt{U^2 - (I_{tot} * R)^2}} \quad (4)$$

where R represents the resistance, $I_c$ represents the current going to or from the capacitor to be measured and $I_{tot}$ represents total current going to or from the capacitance meter. The differentiation between $I_{tot}$ and $I_c$ is required when there are other capacitors connected in parallel with the capacitor to be measured (see FIG. 1).

The resistance is mainly in the cables from the capacitance meter, whereby the it needs to be multiplied with $I_{tot}$ to yield a relevant resistive voltage drop in the calculation. The resistance can for example be calculated by measuring the voltage and current twice at two different frequencies.

Figure 5:
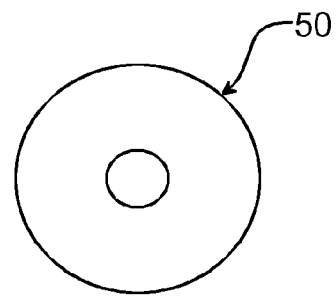
FIG. 5 shows one example of a computer program product comprising computer readable means.

FIG. 5 shows one example of a computer program product comprising computer readable means 50. On this computer readable means 50 a computer program can be stored, which computer program can cause a controller to execute the method according to embodiments described herein. In this example, the computer program product is an optical disc, such as a CD (compact disc), a DVD (digital versatile disc) or a blu-ray disc. The computer readable means can also be solid state memory, such as flash memory or a software package distributed over a network, such as the Internet.

The invention has mainly been described above with reference to a few embodiments. However, as is readily appreciated by a person skilled in the art, other embodiments than the ones disclosed above are equally possible within the scope of the invention.

The invention claimed is:

1. A capacitance meter, comprising:
   an AC source providing a measurement voltage with a measurement frequency to a capacitor;
   a current sensor arranged to measure a current going to or from the capacitance meter;
   a voltage sensor arranged to measure a voltage over the capacitor; and
   a capacitance calculation unit arranged to calculate, using a controller, a capacitance of the capacitor using a measured current from the current sensor, a measured voltage from the voltage sensor and the measurement frequency,
   wherein the capacitance meter is arranged to obtain measurements using the current sensor and the voltage sensor during a measurement duration,
   wherein the measurement frequency and the measurement duration are selected such that the measurement duration equals a multiple of the period of the measurement frequency, and the measurement duration equals a multiple of the period of a mains electricity.

2. The capacitance meter according to claim 1, wherein the measurement duration equals a multiple of the period of a 50 Hz mains electricity.

3. The capacitance meter according to claim 1, wherein the measurement duration equals a multiple of the period of a 60 Hz mains electricity.

4. The capacitance meter according to claim 1, wherein the measurement duration equals a multiple of the period of a 50 Hz mains electricity and the measurement duration equals a multiple of the period of a 60 Hz mains electricity.

5. The capacitance meter according to claim 1, wherein the measurement duration is selected to be 100 ms or a multiple thereof.

6. The capacitance meter according to claim 1, wherein the measurement frequency is a multiple of 10 Hz.

7. The capacitance meter according to claim 1, further comprising:
a second current sensor arranged to measure a current going to or from the capacitor, wherein the current going to or from the capacitor is used by the capacitance calculation unit to calculate the capacitance of the capacitor.

8. A method to measure a capacitance of a capacitor using a capacitance meter, the method comprising:
providing, using an AC source, a measuring voltage with a measurement frequency to the capacitor;
during a measurement duration, measuring, using a current sensor, a current going to or from the capacitance meter, and measuring, using a voltage sensor, a voltage over the capacitor; and
calculating, using a capacitance calculation unit, a capacitance of the capacitor using the measured current, the measured voltage and the measurement frequency,
wherein the measurement frequency and the measurement duration are selected such that the measurement duration equals a multiple of the period of the measurement frequency, and the measurement duration equals a multiple of the period of a mains electricity.

9. The method according to claim 8, wherein the calculating comprises calculating the capacitance of the capacitor using the following formula:

$$C = \frac{I}{2\Pi f U}$$

where C is the capacitance of the capacitor, I is the measured current, f is the measuring frequency and U is the measured voltage.

10. A computer program for measuring capacitance, the computer program comprising:
a non-transitory computer readable medium; and
computer program code recorded on the computer readable medium and which, when run on in a capacitance meter, causes the capacitance meter to perform a method to measure a capacitance of a capacitor using a capacitance meter, the method comprising
providing, using an AC source, a measuring voltage with a measurement frequency to the capacitor,
during a measurement duration, measuring, using a current sensor, a current going to or from the capacitance meter, and measuring, using a voltage sensor, a voltage over the capacitor, and
calculating, using a capacitance calculation unit, a capacitance of the capacitor using the measured current, the measured voltage and the measurement frequency,
wherein the measurement frequency and the measurement duration are selected such that the measurement duration equals a multiple of the period of the measurement frequency, and the measurement duration equals a multiple of the period of a mains electricity.

* * * * *